United States Patent [19]

Matsumaru et al.

[11] Patent Number: 5,431,794
[45] Date of Patent: Jul. 11, 1995

[54] PROCESS FOR FORMING METAL FILMS BY PLASMA SPUTTERING

[75] Inventors: Shigeo Matsumaru; Toru Watanabe, both of Saitama; Akira Kubotsu, Okayama; Shuichi Nogawa, Kyoto; Kiyoshi Ogata, Kyoto; Daisuke Inoue, Kyoto, all of Japan

[73] Assignees: Nissin Electric Co.,, Kyoto; Kuraray Co., Ltd., Okayama, both of Japan

[21] Appl. No.: 130,199

[22] Filed: Nov. 5, 1993

Related U.S. Application Data

[62] Division of Ser. No. 866,358, Apr. 10, 1992, Pat. No. 5,283,095.

[30] Foreign Application Priority Data

Apr. 12, 1991 [JP] Japan .................................. 3-108785
Jan. 16, 1992 [JP] Japan .................................. 4-26115

[51] Int. Cl.$^6$ .................................................. C23C 14/34
[52] U.S. Cl. ........................ 204/192.14; 204/192.26; 204/192.27; 204/298.04; 204/298.26
[58] Field of Search .................. 427/124, 250, 162; 204/192.14, 298.26, 192.26, 192.27, 298.04

[56] References Cited

U.S. PATENT DOCUMENTS

| | | |
|---|---|---|
| 4,426,275 | 1/1984 | Meckel et al. . |
| 4,784,739 | 11/1988 | Kadokura et al. ............... 204/192.2 |
| 5,000,834 | 3/1991 | Yoshikawa ..................... 204/298.08 |
| 5,064,520 | 11/1991 | Miyake et al. ................. 204/192.11 |
| 5,074,984 | 12/1991 | Sichmann et al. . |

FOREIGN PATENT DOCUMENTS

| | | |
|---|---|---|
| 0269111 | 11/1987 | European Pat. Off. . |
| 0316004 | 11/1988 | European Pat. Off. . |
| 422323 | 4/1991 | European Pat. Off. . |
| 59-203994 | 7/1984 | Japan . |
| 89026801 | 7/1988 | Japan . |

OTHER PUBLICATIONS

Weissmantel, "Ion beam deposition of special film structures", J. Vac. Sci. Tech. 18(2) Mar. 1981, pp. 179–185.

Y. Suzuki et al., "Preparation of CoCr thin films on polymer substrates by ion beam sputtering", J. Vac. Sci. Technol. 5(4), Jul/Aug. 1987, pp. 1870–1873.

Primary Examiner—Roy V. King
Attorney, Agent, or Firm—Finnegan, Henderson, Farabow, Garrett & Dunner

[57] ABSTRACT

A metal film high in reflectivity and excellent in adhesion to a synthetic resin substrate even in the case where the metal film is sufficiently thin, is formed on a surface of the substrate by sputtering a metal target by ions through an inert gas plasma in a vacuum vessel, wherein the substrate is covered with an electrostatic shield during the sputtering.

3 Claims, 10 Drawing Sheets

PROCESS FOR FORMING METAL FILMS BY PLASMA SPUTTERING

This is a division of application Ser. No. 07/866,358, filed Apr. 10, 1992, now U.S. Pat. No. 5,283,095.

BACKGROUND OF THE INVENTION

The present invention relates to a process for forming a metal film on a surface of a synthetic resin substrate and to an aluminum film coated matter formed by coating a surface of a synthetic resin substrate with an aluminum film.

Heretofore, synthetic resin substrates such as acrylic resin moldings, provided with metal films formed on the respective surfaces thereof, are used in miscellaneous decoration goods, optical parts, optical recording media, etc. Particularly, optical discs such as video discs for which the demand has increased remarkably in recent years, are provided by forming metal films such as aluminum films as reflection films on the respective surfaces of transparent synthetic resin substrates having recording pits corresponding to audio signals, video signals, etc.

The metal films on this type substrates are heretofore formed mainly by a technique of vacuum evaporation. In recent years, an attempt to form the films by a technique of plasma sputtering (parallel plate plasma sputtering) has been made.

The technique of vacuum evaporation is, in general, applied to an arrangement in which an evaporation source 8 and synthetic resin substrates 6 such as acrylic resin moldings opposite to the evaporation source 8 are provided in a vacuum vessel 2 as shown in FIG. 16, and it is a technique for respectively forming films of a metal such as aluminum on the respective surfaces of the substrates 6 by depositing particles 10 of a metal such as aluminum on the respective surfaces of the substrates 6 through evaporating the metal particles 10 from the evaporation source 8 by means of electron beam heating or resistance heating. The substrates 6 may be generally mounted on rotary holders 4 as shown in FIG. 16. To increase the number of substrates to be subjected to film forming, a large number of substrates 6 may be arranged along the circumferential wall of a cylindrical vacuum vessel 2 having an evaporation source 11 in its center as shown in FIGS. 17 and 18. The evaporation source 11 has a large number of tungsten heaters 14 stretched between two props 12, and a large number of evaporation materials 16 such as aluminum attached thereto, so that the respective evaporation materials 16 are evaporated through heat generated by energizing the respective tungsten heaters 14. The reference numeral 18 designates a current input terminal. The substrates 6 are mounted on the holders 4 supported through rotary shafts 22 to holder supports 20, respectively, and they are rotated in the direction of the arrow A as shown in FIG. 17 in the vacuum vessel 2 as a whole.

The technique of plasma sputtering is, in general, applied to an arrangement in which a sputtering source 24 (for example, magnetron type sputtering source) having a metal target 28 such as aluminum attached to the upper portion of a magnet 26 and synthetic resin substrates such as acrylic resin moldings opposite to the sputtering source 24 are provided in a vacuum vessel 2 as shown in FIG. 19, and it is a technique for respectively forming films of a metal such as aluminum on the respective surfaces of the substrates 6 by depositing metal particles on the respective surfaces of the substrates 6 through sputtering the metal target 28 through plasma 30 generated between the sputtering source 24 and the respective substrates 6 by a magnetic field formed in the neighborhood of the surface of the metal target 28, an electric field applied between the respective substrates 6 (in the strict sense, holders 4 therefor) and the metal target 28, and the like, in the vacuum vessel 2 in which an argon gas is introduced.

In the case where films are formed by the conventional technique of vacuum evaporation, however, the adhesion of metal films such as aluminum films to synthetic resin substrates such as acrylic resin moldings exhibits practicable strength but varies so widely as to be deficient in stability. Further, reflectivity is proportional to film thickness when the film thickness is not more than about 600 Å. There arises a problem in that sufficient reflectivity cannot be obtained stably unless each of the metal films such as aluminum films has a film thickness of about 600 Å at the least. This is because the kinetic energy of evaporated metal particles such as aluminum particles is considered to be so low as about 0.1 ev that the metal films deposited on the substrates are poor in fineness, crystalline arrangement, etc.

In the present state, metal reflection films of aluminum are most widely put into practical use in the field of optical discs such as video discs. In particular, in the case of optical discs, the characteristic (for example, S/N ratio) thereof is determined by the reflectivity of aluminum films formed on pits as well as the form of the pits with respect to signal reproduction. In general, good images cannot be reproduced unless the reflectivity is not less than about 70%. Further, it is necessary in view of the producing process that the formed aluminum films sufficiently adhere to synthetic resin substrates.

An attempt to reduce the film thickness of aluminum films to attain both material saving and reduction of film-forming time to thereby attain improvement in producing efficiency is effective for reduction in cost of optical discs. The conventional technique of vacuum evaporation, however, has a problem in that the aluminum films cannot be thinned so as to be not more than about 600 Å in view of the reflectivity.

Further, the technique of vacuum evaporation requires a large number of work steps because of problems on the lifetime of the resistors (for example, tungsten heaters 14 as shown in FIGS. 17 and 18) for resistance heating in the evaporation source, and on the supply of a metal such as aluminum being an evaporation material. Accordingly, a substantial problem against reduction in cost, that is, limitation in producing efficiency and stability of production, is inherent in the technique of vacuum evaporation. Such a problem is also inherent in a recently developed technique (so-called in-line single disk production system) in which evaporation is applied to substrates one by one, as well as the aforementioned technique (so-called batch type stand alone system) in which evaporation is applied to a large number of substrates at once as shown in FIGS. 16 and 17.

On the other hand, in the technique of plasma sputtering, a continuous operation can be made until the initially arranged metal target such as aluminum is worn out. This is effective for improvement in producing efficiency. Further, sufficient reflectivity can be obtained stably if the film thickness of metal films such as aluminum films is not less than 500 Å. The technique of plasma sputtering, however, has a problem in that the adhesion of metal films, especially, aluminum films, to synthetic resin substrates such as acrylic resin moldings is insufficient.

The lowering of the adhesion of aluminum films is considered to be caused by resin ,surface deterioration, involving in resin injury due to temperature, produced by exposing surfaces of synthetic resin substrates to high-density plasma at the film-forming time and by some interaction between the aluminum films and impurity gas released from resin surfaces by heat due to inflow of acceleration electrons accelerated to high energy in an electric field, into the substrates as the anode side.

Further, in the case where the aluminum film formed by the aforementioned technique of vacuum evaporation or plasma sputtering is used as a reflection film of an optical information recording medium, the generally obtained performance thereof is heretofore limited to a range of about 72% to about 80% as its reflectivity and a range of about 38 dB to about 41 dB as S/N ratio of the regenerative output. In the case where high picture quality is required, that is, in the case where, for example, the aluminum film is used for reproduction of high definition television images, there arises a problem in that the reproduced images are insufficient in sharpness if the reflectivity and S/N ratio is limited as described above.

In the case where the technique of vacuum evaporation is used, an aluminum film having higher reflectivity (80 to 85%) and higher S/N ratio (41 to 45 dB) can be provided by reducing the amount of oxidized alminum in the aluminum film. The aluminum film thus provided, however, has a tendency that there occurs easily a durability problem in that both rising of noise and lowering of recording strength are brought by corrosion and the like caused by moisture absorption oxidation and chemical reaction when the aluminum film is left for a long time. Accordingly, there arises a problem in that improvement in both the performance (reflectivity and S/N ratio) of the film and durability thereof cannot be attained simultaneously.

SUMMARY OF THE INVENTION

Therefore, a first object of the present invention is to provide a process for efficiently forming metal films being high in reflectivity and good in adhesion to synthetic resin substrates regardless of the reduction in film thickness of the metal films, thus to eliminate the aforementioned disadvantages from the two conventional techniques.

A second object of the present invention is to provide an aluminum film coated matter having an aluminum film high in light reflectivity and excellent in durability.

In order to attain the first object, a first process according to the present invention is characterized in that a metal film having a film thickness of 50 Å to 400 Å is formed on a surface of a synthetic resin substrate by sputtering a metal target through an inert gas ion beam in a vacuum atmosphere.

In order to attain the first object, a second process according to the present invention is characterized in that a film thickness of 50 Å to 400 Å is formed on a surface of a synthetic resin substrate by sputtering a metal target through ions in inert gas plasma in a vacuum atmosphere while using means for preventing diffusion of plasma to the surface of the synthetic resin substrate and for preventing inflow of acceleration electrons from the plasma to the surface of the synthetic resin substrate.

The second object can be achieved by an aluminum film coated matter having an aluminum film as a constituent member of the aluminum film coated matter, in which: the aluminum film contains aluminum crystals at a portion in the film at a depth D of not more than 600 Å from a film surface thereof which contacts with a substrate, the aluminum crystals having a relation in which a crystal axis <111> perpendicular to a (111) plane is perpendicular or substantially perpendicular to the film surface.

The second object can be achieved also by an aluminum film coated matter having an aluminum film as a constituent member of the aluminum film coated matter, in which: the aluminum film contains aluminum crystals at a portion in the film at a depth D of not more than 600 Å from a film surface thereof which contacts with a substrate, the aluminum crystals exhibiting a diffraction X-ray spectrum of a (111) plane when measured by X-ray diffraction according to a diffractometer method under the following condition:

target: Cu,

X-ray type: K$\alpha$ ray, measurement X-ray output: voltage 40 KeV, current 30 mA, longitudinal divergence limiting Sollar's slit: horizontal type, incident height limiting slit: 5 mm, incident slit: 0.4 mm, light-receiving Sollar's slit: vertical type, width limiting slit: 5 mm, diffraction X-ray monochromator: graphite horizontal plate, and diffraction Method: $\theta/2\theta$ method.

The first process according to the present invention is called "ion beam sputtering". In this process, a surface of a metal target such as an aluminum target is beaten by an inert gas ion beam, so that metal particles flown out therefrom are deposited on the synthetic resin substrate such as an acrylic resin molding to thereby form a metal film on the synthetic resin substrate. In this process, theoretically, not only there is no plasma in the neighborhood of the surface of the synthetic resin substrate, but there is no acceleration electron released from plasma. Accordingly, surface deterioration of the synthetic resin substrate and generation of an impurity gas as observed in the conventional technique of plasma sputtering can be prevented, so that a metal film high in adhesion can be formed.

The second process according to the present invention technically belongs to the category of plasma sputtering. In this process, a surface of a metal target such as an aluminum target is beaten by ions in inert gas plasma, so that metal particles flown out therefrom are deposited on the synthetic resin substrate such as an acrylic resin molding to thereby form a metal film on the synthetic resin substrate. Further, this film forming process is carried out while using means for preventing diffusion of plasma to the surface of the synthetic resin substrate and for preventing inflow of acceleration electrons from the plasma to the surface of the synthetic resin substrate. Accordingly, surface deterioration of the synthetic resin substrate and generation of an impurity gas as observed in the conventional technique of plasma sputtering can be prevented, so that a metal film high in adhesion can be formed.

Preferred examples of ions or ion beams used in the aforementioned process are ions or ion beams of inert gases such as argon gas, helium gas, neon gas, krypton gas, xenon gas, etc. If ions or ion beams of other gases such as nitrogen gas, oxygen gas, etc., are used, the reflectivity of metal films such as aluminum films may be lowered by interaction thereof with the metal films.

Metal particles such as aluminum particles sputtered by this process have moderate kinetic energy of the order of several eV to about 20 eV. This energy contributes to improvement in the crystallization of the films, so that the metal films such as aluminum films accumulated on the synthetic resin substrates have a very fine structure, saying to be close-packed structure, and accordingly, the metal films are high in reflectivity even if the film thickness thereof is thin.

However, according to experiments of the inventors of the present invention, metal films formed by the technique of ion beam sputtering or the like are so high in internal stress that a predetermined correlation may often occur between adhesion and film thickness. Therefore, both reflectivity and film thickness have been estimated about metal films having various film thicknesses. As a result, it has been found that metal films being good both in reflectivity and in adhesion can be formed when the film thickness thereof is in a range of 50 Å to 400 Å.

In practical use, the degree of vacuum in the atmosphere at the deposite time is preferably higher than about $4.0 \times 10^{-4}$ Torr. Further, the energy of the ion beam is preferably higher than 100 eV which is a limit on sputtering. Generally, a range of about 200 eV to about 10 KeV can be used easily as the energy. Although the deposite rate is in a range of 1 Å/sec to 500 Å/sec when the energy of the ion beam is in the aforementioned range, the deposite rate is preferably lower than 200 to 400 Å/sec in view of stability of production.

Examples of the metal target used in the present invention include aluminum, platinum, gold, silver, chromium, and alloys thereof.

The synthetic resin used in this invention is not limited specifically. Examples of the synthetic resin are acrylic resin, polystyrene, polycarbonate, polyolefin, modified epoxy resin, etc. These resins may be provided as homopolymers, copolymers of mixtures thereof. The aforementioned resins which are optical transparent resins used as optical disc substrate materials are preferably used in this invention.

Also, the acrylic resin used most preferably is not limited specifically. Preferred examples of the acrylic resin are resins high in transparency and excellent in other optical properties, such as methyl methacrylate polymer, methyl meth-acrylate-alkyl acrylate (C1 to C4) copolymer, methyl methacrylate-cyclohexyl methacrylate copolymer, methyl methacrylate-cyclohexyl methacrylate-bromhexyl methacrylate copolymer, methacrylate-maleimide copolymer, methacrylate-methacrylimide copolymer, methacrylate-styrene copolymer, etc., and mixture resin compositions of these resins and synthetic transparent resins such as polycarbonate, etc.

The shape of the synthetic resin substrates such as acrylic resin moldings is not limited specifically but preferred examples thereof are smooth shapes such as a disc shape, a plate shape, etc. Any suitable method selected from general methods such as a cast molding method, an injection molding method, a compression molding method, a laminating method, etc., can be employed as the method of forming the substrates.

By the way, the aluminum film coated matter of the present invention was attained through the present inventors' investigation for the structure of an aluminum film formed on a substrate.

That is, it has been found from various researches that the problem on reflectivity and durability of the conventional aluminum film coated matter is caused by the poor fineness and poor crystal arrangement of the aluminum film formed on a substrate. That is, the conventional aluminum film is porous (a polycrystalline substance not oriented). Accordingly, if the amount of oxidized alminum not contributing to light reflection is reduced by reducing the oxygen content of the film, the reflectivity of the film is improved but on the contrary the durability thereof is lowered because a tendency to increase the amount of water (or the like) penetrating into the film is brought by reduction of the amount of oxide for filling the porous portion.

Accordingly, it has been found that an arrangement in which the aluminum film contains aluminum crystals oriented preferentially in a direction effective for light reflection, has an effect on achieving both high reflectivity and high durability. More specifically, light reflection is brought by interaction between incident light and aluminum atoms, so that higher reflectivity can be provided as the surface density of aluminum atoms in a surface perpendicular to the incident light increases. That is, aluminum has a plane-centered cubic lattice crystal structure, so that the (111) plane is a surface packing aluminum crystals at highest density. Accordingly, an aluminum film high in reflectivity can be provided by containing aluminum crystals preferentially oriented to the (111) plane and having the high-density packed surface of the crystal lattice in a section parallel or substantially parallel to the film surface, that is, by containing aluminum crystals having a relation in which a crystal axis <111> perpendicular to the (111) plane is perpendicular or substantially perpendicular to the film surface as described above. This is particularly effective in the case where the incident light enters perpendicularly or substantially perpendicularly to the aluminum film surface.

The aluminum film having such crystal orientation is also fine, so that penetration of water or the like can be prevented and, accordingly, the aluminum film is excellent in durability.

The reason why the depth at which the oriented aluminum crystals exist is limited to a depth of not more than 600 Å, is as follows. That is, in the case where light enters at the substrate side, the aluminum layer contributing to light reflection is in a depth range of not more than 600 Å from the aluminum film surface which contacts with the substrate. The aluminum layer more effectively contributing to light reflection is in a depth range of not more than 400 Å. Accordingly, if the oriented aluminum crystals do not exist in the aforementioned depth range, sufficient reflectivity cannot be provided even if the oriented aluminum crystals are included.

In the aforementioned aluminum film, it is preferable in view of improvement of reflectivity that a minimum value in the percentage distribution of the mole ratio (Al-O/Al) of oxidized alminum (Al-O) in a direction of the depth of the aluminum film to total aluminum (Al), measured by using an X-ray photo-electron spectroscopy, is not more than 30%, more preferably, in a range of 10 to 25%. As described above, also in the technique of vacuum evaporation, a film high in reflectivity can be provided by reducing the amount of oxidized alminum contained in the aluminum film. However, if the amount of oxidized alminum in the film is not adjusted to about 35%, a problem arises in that lowering of durability is brought by oxidation due to moisture absorption, corrosion and the like when the aluminum film is left for a long time. On the contrary, in the case of the aluminum film containing aluminum crystals preferentially oriented to the (111) plane as in this invention, there is no problem of lowering of durability because the aluminum film is so fine that there is little penetration of water or the like. Accordingly, in this invention, reflectivity can be improved more greatly by reducing the amount of oxidized alminum.

The film thickness of the aluminum film of the aluminum film coated matter is not limited specifically but it is generally set in a range of 50 to 600 Å, preferably, in a range of 100 to 400 Å under the consideration of producing efficiency and durability as well as reflectivity, because the portion not contributing to light reflection increases as the film thickness increases. In the case where the film thickness of the aluminum film is not more than 600 Å, aluminum crystals having the aforementioned crystal orientation can be arranged at an arbitrary depth in the aluminum film. Of course, aluminum crystals can be arranged in the whole area in the aluminum film.

Further, it has been found from various researches that increasing of the kinetic energy of aluminum particles accumulated on the substrate has an effect on forming the aforementioned aluminum film on the substrate particularly at a low substrate temperature which is nearly equal to room temperature.

Examples of the method for increasing the kinetic energy of aluminum particles deposited on the substrate include an ion beam sputtering technique, an evaporation technique using ion beam radiation, an ion beam depositing technique, an ion cluster beam technique, etc. The kinetic energy of deposited particles can be generally increased from the order of several eV to the order of hundreds of eV by using these techniques singly or in combination. The method used for forming the aluminum film coated matter according to this invention is not limited to specific one of the aforementioned techniques but the preferred example thereof is the ion beam sputtering technique by which the surface of the substrate made of a synthetic resin is free from damage due to plasma and heat.

DETAILED DESCRIPTION OF THE INVENTION

Figure 1:
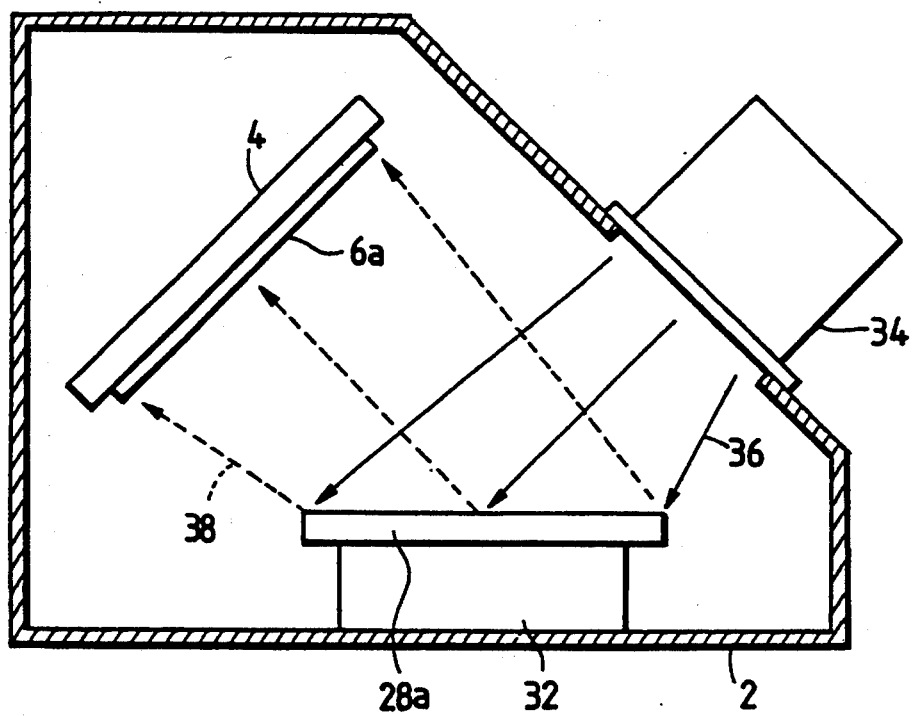
FIG. 1 is a schematic view showing an example of an ion beam sputtering apparatus for carrying out a metal film forming process according to the present invention.

FIG. 1 is a schematic view showing an example of an ion beam sputtering apparatus for carrying out a process for forming metal films according to the present invention. A holder 4 for holding an acrylic resin substrate 6a for an optical disc as an example of a synthetic resin substrate and a target holder 32 for holding an aluminum target 28a as an example of a metal target opposite to the acrylic resin substrate 6a are provided in a vacuum vessel 2. Further, an ion source 34 is attached to the wall of the vacuum vessel 2 so as to be directed toward the aluminum target 28a on the target holder 32. The ion source 34 radiates an inert gas ion beam 36 of inert gas ions such as argon gas ions toward a surface of the aluminum target 28a to thereby sputter the aluminum target 28a.

Using the aforementioned apparatus, film forming was made as follows. That is, after an acrylic resin substrate 6a having a diameter of 300 mm was mounted on the holder 4 and the high-purity aluminum target 28a was mounted on the target holder 32, the vacuum vessel 2 was evacuated to $2.0 \times 10^{-5}$ Torr. The inert gas ion beam 36 was drawn out from the ion source 34 in the following condition and radiated toward a surface of the aluminum target 28a, so that aluminum particles 38 beaten out of the aluminum target 28a were deposited on a surface of the acrylic resin substrate 6a to thereby form an aluminum film on the acrylic resin substrate 6a. The thickness of the aluminum film was adjusted by the deposite time.

Ion Type: argon
Ion Energy: 1500 eV
Beam Current: 300 mA

Figure 2:
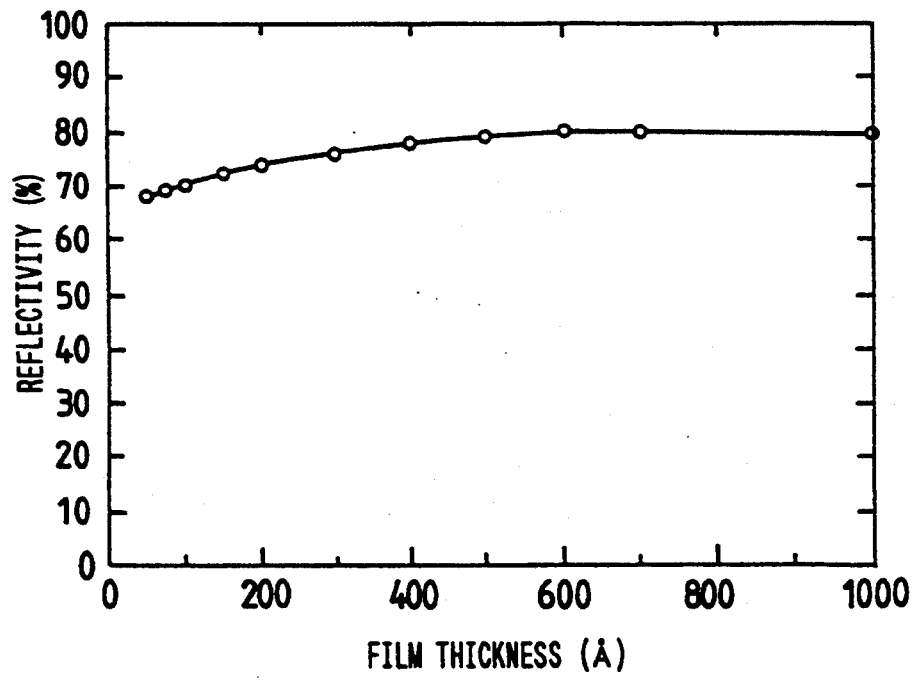
FIG. 2 is a graph showing an example of the measurement result of the thickness-reflectivity characteristic of an aluminum film.

An example of the measurement result of the thickness-reflectivity characteristic of the aluminum film formed on the surface of the acrylic resin substrate 6a as described above is shown in FIG. 2. Although details of the result will be collectively shown in Table 1, reflectivity of not less than 68% was obtained when the film thickness was not less than 50 Å.

The adhesion of the aluminum film to the acrylic resin substrate 6a was estimated by a tape peeling test in which an adhesive plane of a transparent adhesive tape was sufficiently pressed to a surface of the aluminum film and then rapidly vertically peeled from the surface. As a result, separation of the aluminum film was always observed when the film thickness was not less than 500 Å; separation of the aluminum film was sometimes observed when the film thickness was 400 Å; and separation of the aluminum film was not observed when the film thickness was less than 400 Å.

These results, together with results of conventional comparative examples are collectively shown in Table 1.

TABLE 1

| Deposite technique | Film thickness | Reflectivity | Adhesion | Total estimation | Remarks |
|---|---|---|---|---|---|
| Vacuum evaporation | 600Å | 70% | Δ | Δ | Conventional example |
| The same as above | 300Å | 58% | Δ | x | Conventional example |
| Plasma sputtering | 500Å | 70% | x | x | Conventional example |
| Ion beam sputtering | 50Å | 68% |   | Δ | This invention |
| The same as above | 100Å | 70% |   |   | This invention |

TABLE 1-continued

| Deposite technique | Film thickness | Reflectivity | Adhesion | Total estimation | Remarks |
|---|---|---|---|---|---|
| The same as above | 300Å | 76% |   |   | This invention |
| The same as above | 400Å | 78% | Δ | Δ | This invention |
| The same as above | 500Å | 78% | x | x | Out of this invention |

In this Table, o represents "Excellent", Δ represents "Practicable" more or less inferior to "Excellent", and x represents "Failure". As the wave length used for measuring reflectivity was 780 nm which was the wave length of a semiconductor laser for optical discs.

As is obvious from this Table, according to the process of the present invention, reflectivity of not less than about 70% can be secured when the thickness of the aluminum film is in a range of 50 Å to 400 Å, that is, when the film thickness is not more than two thirds the film thickness in the conventional technique of vacuum evaporation. Further, more excellent adhesion than that in the conventional technique of plasma sputtering can be obtained.

Further, an image pattern was reproduced from a video disc produced by forming an aluminum film on an acrylic resin substrate 6a by the aforementioned process and the image pattern was estimated. As a result, it was confirmed that the same characteristic (such as S/N ratio) as obtained by the conventional process was obtained even in the case where the film thickness was less than that obtained by the conventional process.

Unlike the aforementioned embodiment, in the practical deposite process, film forming may be applied to a plurality of acrylic resin substrates at once. Further, in this case, the respective acrylic resin substrates may be rotated to make aluminum thin films even.

Using gold, silver, copper and platinum targets, thin films as other metal films than the aluminum films were respectively formed on surfaces of acrylic resin substrates by the same ion sputtering apparatus as shown in FIG. 1. The deposite condition was as follows.

Ion Type: argon
Ion Energy: 1000 eV
Beam Current: 60 mA

Measurement results about the reflectivity, adhesion, etc. of the metal films formed on the surfaces of the acrylic resin substrates by this process, together with results obtained by the conventional process as comparative examples, are collectively shown in Table 2.

TABLE 2

| Material | Film-forming | Film thickness | Reflectivity | Adhesion | Total estim. | Remarks |
|---|---|---|---|---|---|---|
| Gold | IBS | 300Å | 78% |   |   | This invention |
|   | PS | 300Å | 70% | x | x | Conventional example |
|   | EB | 300Å | 60% | Δ | x | Conventional example |
| Silver | IBS | 300Å | 85% |   |   | This invention |
|   | PS | 300Å | 72% | x | x | Conventional example |
|   | EB | 300Å | 63% | Δ | x | Conventional example |
| Copper | IBS | 300Å | 76% | Δ | Δ | This invention |
|   | PS | 300Å | 68% | x | x | Conventional example |

TABLE 2-continued

| Material | Film-forming | Film thickness | Reflectivity | Adhesion | Total estim. | Remarks |
|---|---|---|---|---|---|---|
| | EB | 300Å | 60% | x | x | conventional example |
| Platinum | IBS | 300Å | 68% | | Δ | This invention |
| | PS | 300Å | 58% | x | x | Conventional example |
| | EB | 300Å | 50% | Δ | x | Conventional example |

In this Table, IBS represents an ion beam sputtering technique, PS represents a conventional plasma sputtering technique, and EB represents a conventional vacuum evaporation technique. The wave length used for measuring reflectivity was 780 nm which was the same as described above.

As is obvious from this Table, it can be said that the gold, silver and copper films formed by the process according to the present invention are so excellent both in reflectivity and in adhesion as to be adapted for optical discs, and that the platinum film is more or less inferior but practicable in reflectivity and is excellent in adhesion. The gold, silver and platinum films formed by the conventional vacuum evaporation technique may be said to be practicable in adhesion but cannot be said to be practicable in reflectivity as adapted for optical discs because the films are so thin that the reflectivity thereof becomes bad. The metal films formed by the conventional plasma sputtering technique are bad in adhesion.

Figure 3:
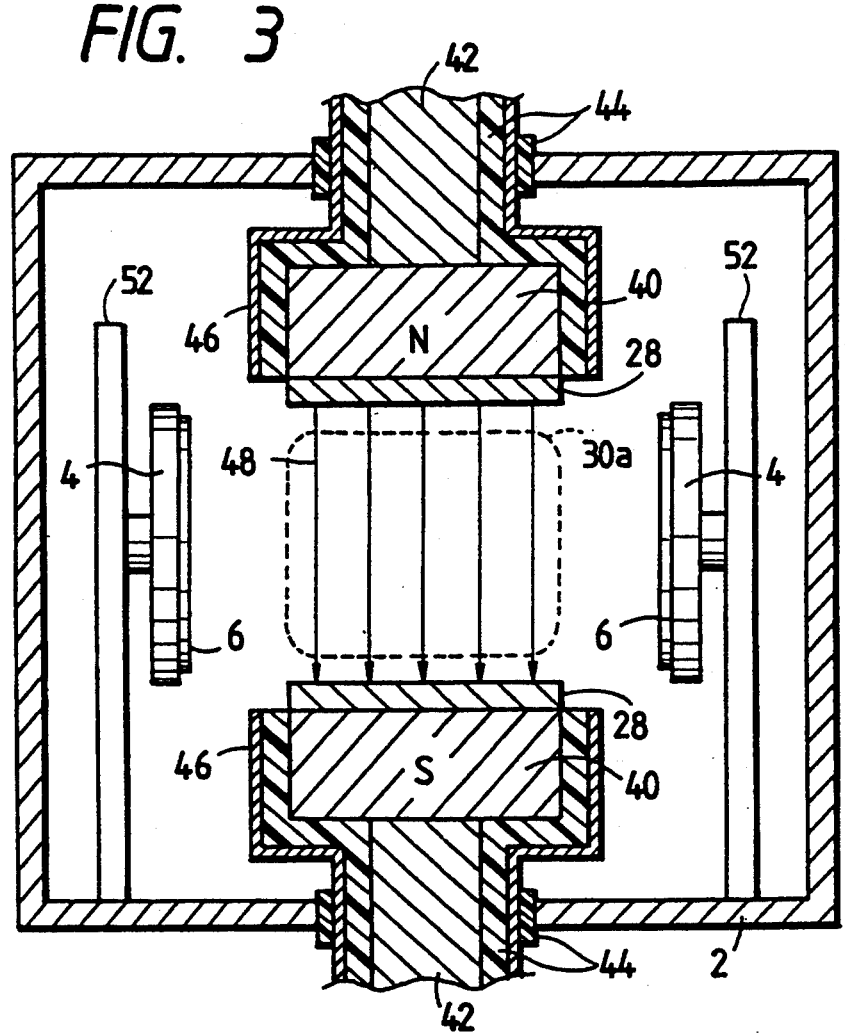
FIG. 3 is a schematic view showing an example of a plasma sputtering apparatus for carrying out a metal film forming process according to the present invention.
Figure 4:
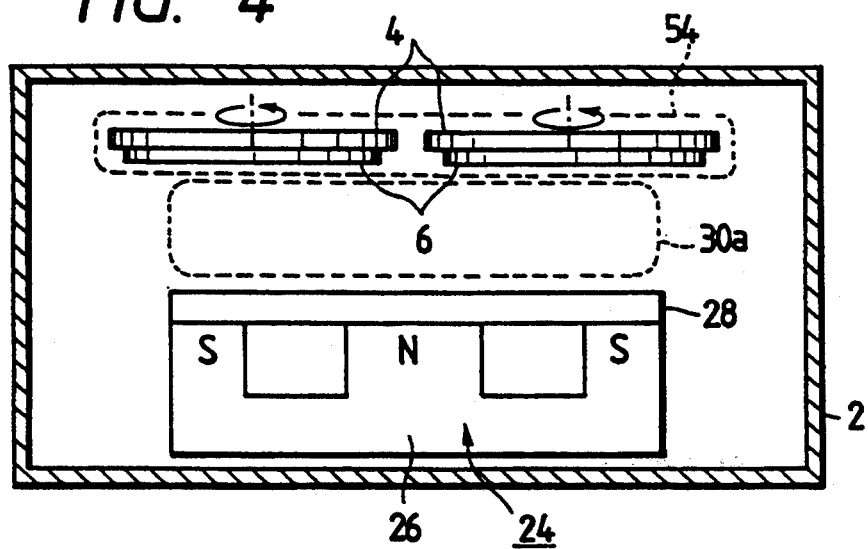
FIG. 4 is a schematic view showing another example of a plasma sputtering apparatus for carrying out a metal film forming process according to the present invention.

Examples of plasma sputtering apparatus having means of preventing diffusion of plasma to surfaces of synthetic resin substrates and preventing inflow of acceleration electrons to the surfaces of the substrates are shown in FIGS. 3 and 4.

The apparatus shown in FIG. 3 uses opposed target sputtering technique. In this apparatus, two metal targets 28 are arranged in a vacuum vessel 2 so as to be opposite to each other. Magnets 40 different in polarity are arranged in the back of the metal targets 28, respectively. The reference numeral 42 designates holders. A plurality of synthetic resin substrates 6 mounted on the holders 4 are arranged around the opposite metal targets 28. The reference numeral 52 designates supports for holders. Further, cylindrical anodes 46 are arranged around the metal targets 28, respectively. The reference numeral 44 designates electrical insulating substances.

In this apparatus, high-density inert gas plasma 30a is generated between the two metal targets 28 by an electric field formed between the anodes 46 and the metal targets 28 and a magnetic field (the reference numeral 48 designates magnetic force lines as a typical example) formed between the opposite metal targets 28, when an inert gas is introduced in the vacuum vessel 2 to form moderate pressure and at the same time a voltage is applied between the anodes 46 and the metal targets 28. Furthermore, not only the inert gas plasma 30a is enclosed in a space by the magnetic field formed between the opposite metal targets 28 but acceleration electrons trying to go out of the inert gas plasma 30a are enclosed in the same space by the magnetic field in the same manner as described above. Accordingly, damage given to surfaces of the synthetic resin substrates 6 by the plasma and the acceleration electrons can be prevented.

Figure 19:
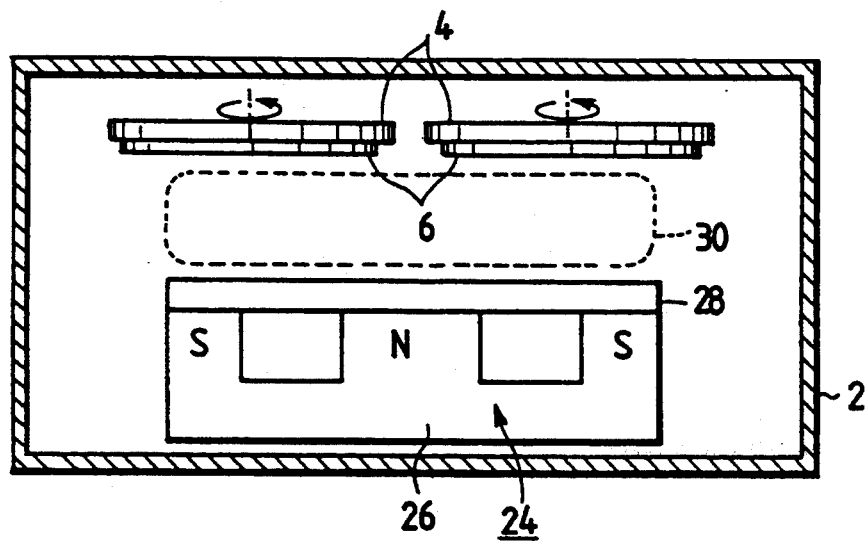
FIG. 19 is a schematic view showing an example of a conventional plasma sputtering apparatus.
Figure 18:
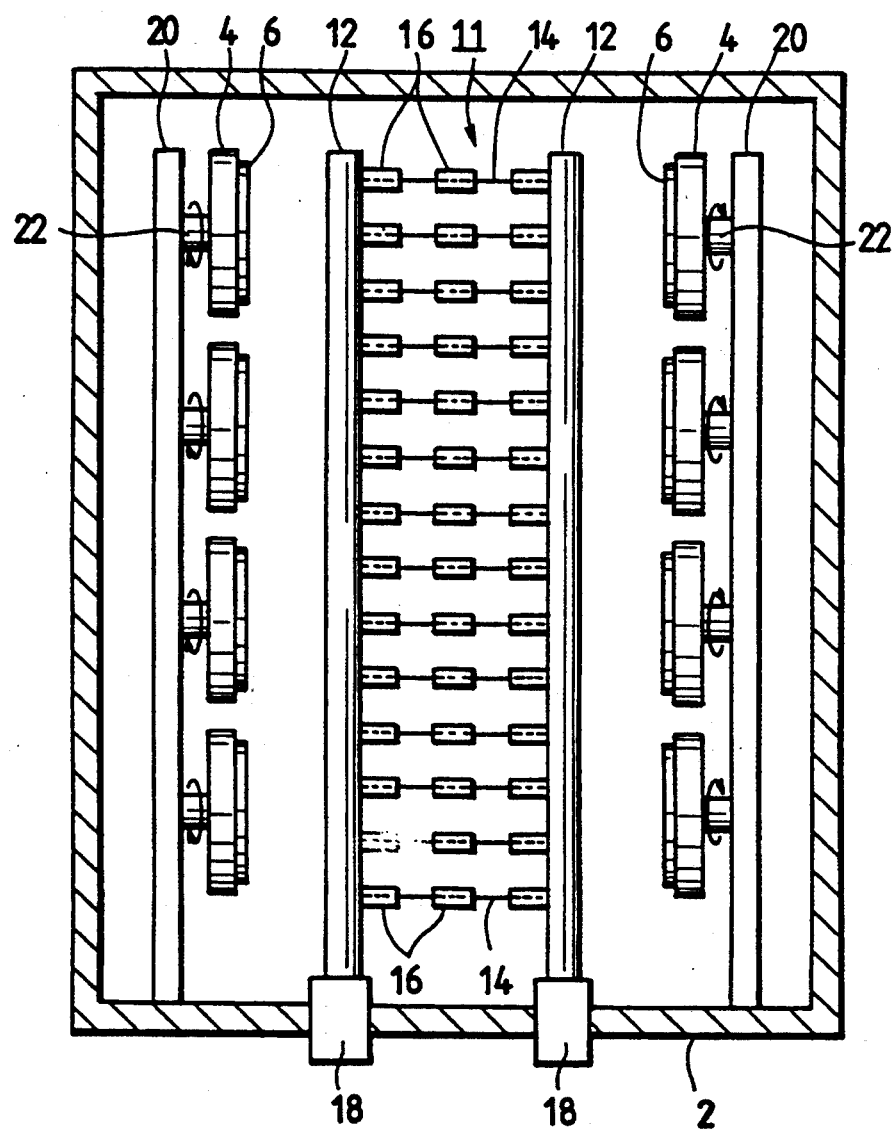
FIG. 18 is a side view of the apparatus depicted in FIG. 17.

The apparatus shown in FIG. 4 basically uses the same magnetron sputtering technique as used in the apparatus shown in FIG. 19. In this apparatus, a mesh-like electrostatic shield 54 of not lower in electric potential than the holders 4 is arranged so that the neighborhood of the surfaces of the synthetic resin substrates 6 mounted on the holders 4 can be covered at the least.

When the aforementioned electrostatic shield 54 is used, inert gas plasma 30a is generated between the electrostatic shield 54 and the sputtering source 24 and at the same time there is no electric field generated between the electrostatic shield 54 and the holders 4 or, if there is any electric field, the electric field serves to press the inert gas plasma 30a back. Accordingly, the inert gas plasma 30a cannot pass through the electrostatic shield 54, so that the inert gas plasma 30a cannot be diffused to the side of the synthetic resin substrates 6. Further, acceleration electrons from the inert gas plasma 30a cannot flow in the electrostatic shield 54, so that the acceleration electrons cannot reach the synthetic resin substrates 6. Accordingly, damage given to the surfaces of the synthetic resin substrates 6 by the plasma and the acceleration electrons can be prevented.

The excellent characteristic of metal films formed on surfaces of synthetic resin substrates by the aforementioned processes according to the present invention can be widely used for other purposes than the purpose for optical discs. For example, the metal films can be used as metal reflection films in miscellaneous decoration goods, optical parts, etc.

As described above, according to the present invention, metal films high in reflectivity and excellent in adhesion to synthetic resin substrates can be formed even in the case where the metal films are sufficiently thin. As a result, material saving and shortening of deposite time can be attained, so that an improvement in producing efficiency can be attained. Accordingly, reduction in cost of optical discs or the like can be attained. Further, the processes according to the present invention technically belongs to the category of sputtering, so that, unlike the vacuum evaporation technique, the film forming processes can be continued before the initially arranged metal target is worn out. Accordingly, metal films can be formed efficiently, so that improvement in producing efficiency can be also attained in this sense.

Next, an aluminum film coated matter having an aluminum film according to the present invention will be described.

Figure 5:
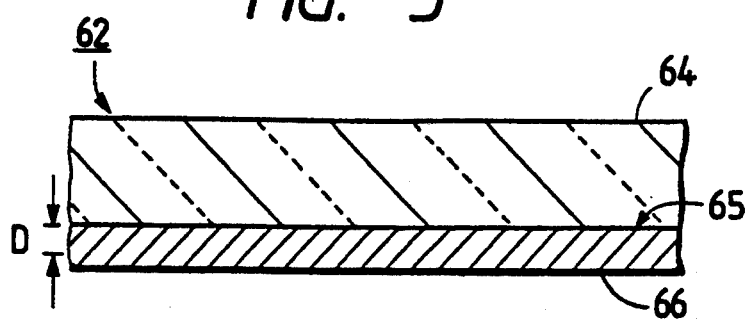
FIG. 5 is a sectional view schematically showing an example of an aluminum film coated matter according to the present invention.
Figure 6:
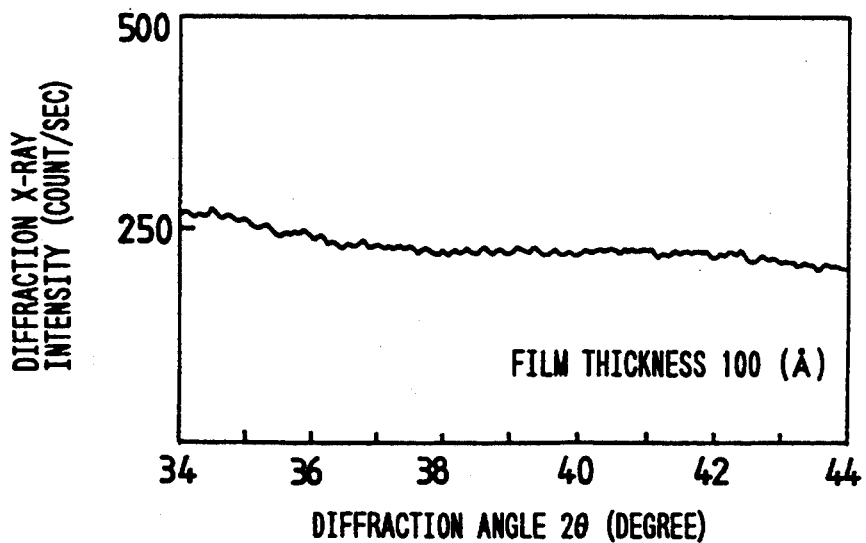
FIG. 6 is a schematic graph showing an example of the result of the X-ray diffraction analysis of an aluminum film formed by the ion beam sputtering technique in the case where the thickness of the aluminum film is 100 Å.
Figure 7:
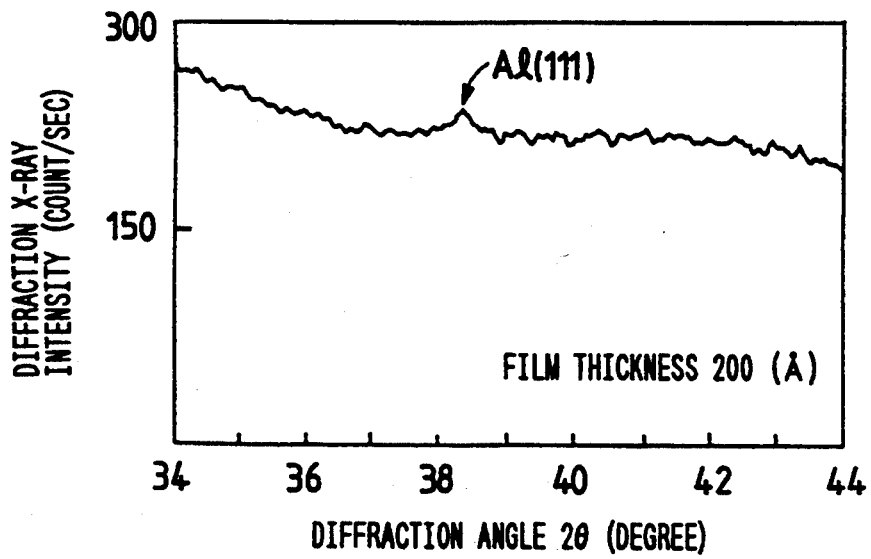
FIG. 7 is a schematic graph showing an example of the result of the X-ray diffraction analysis of an aluminum film formed by the ion beam sputtering technique in the case where the thickness of the aluminum film is 200 Å.
Figure 8:
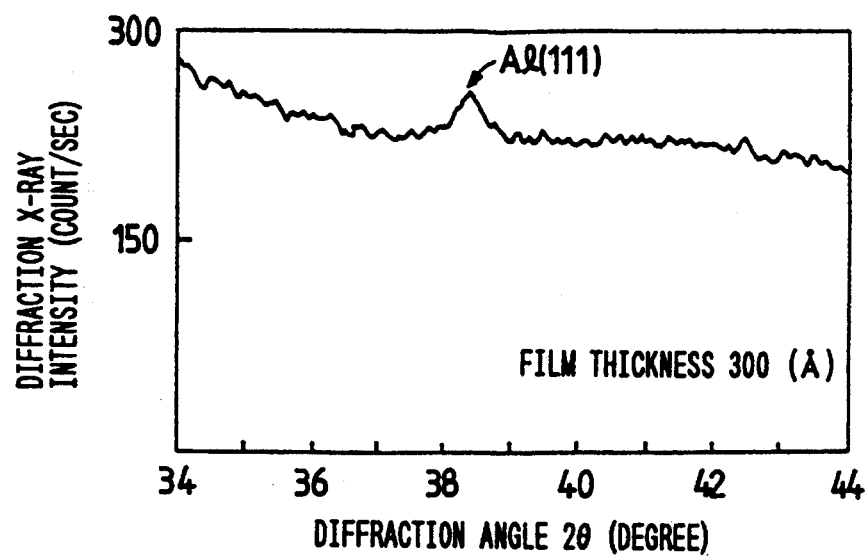
FIG. 8 is a schematic graph showing an example of the result of the X-ray diffraction analysis of an aluminum film formed by the ion beam sputtering technique in the case where the thickness of the aluminum film is 300 Å.
Figure 9:
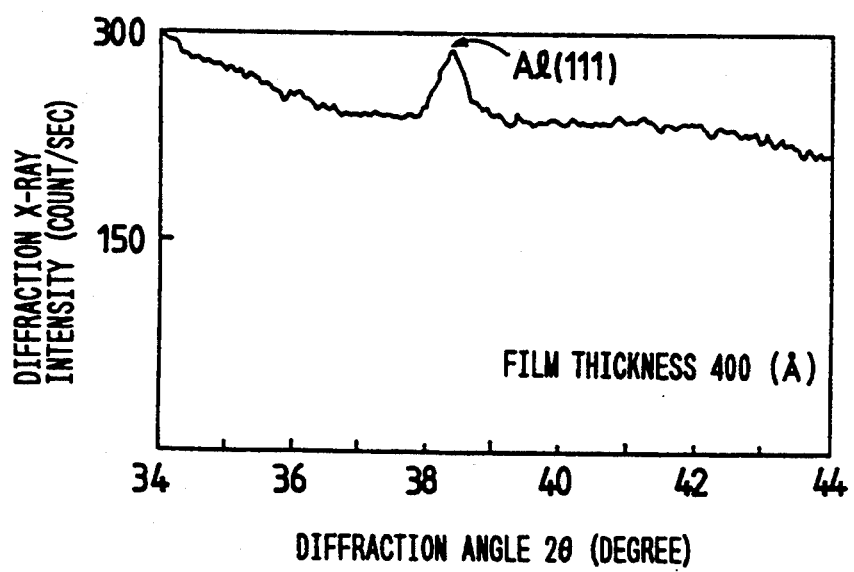
FIG. 9 is a schematic graph showing an example of the result of the X-ray diffraction analysis of an aluminum film formed by the ion beam sputtering technique in the case where the thickness of the aluminum film is 400 Å.
Figure 10:
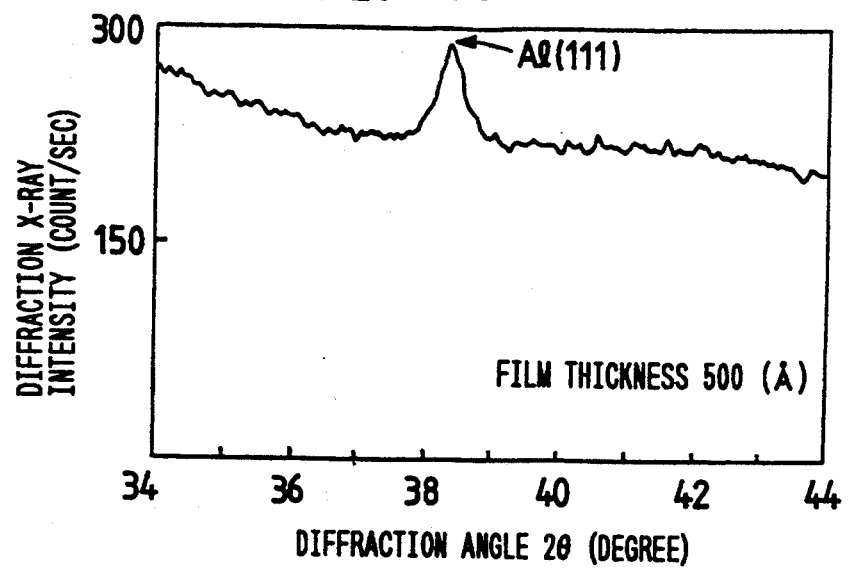
FIG. 10 is a schematic graph showing an example of the result of the X-ray diffraction analysis of an aluminum film formed by the ion beam sputtering technique in the case where the thickness of the aluminum film is 500 Å.

As shown in FIG. 5, an aluminum film 66 of an aluminum film coated matter 62 contains aluminum crystals at a portion in the film at a depth D of not more than 600 Å from a film surface 65 thereof which contacts with a substrate 64, the aluminum crystals having a relation in which a crystal axis <111> perpendicular to a (111) plane is perpendicular or substantially perpendicular to the film surface 65.

Also, according to the present invention, the aluminum film 66 contains aluminum crystals at a portion in the film at a depth D of not more than 600 Å from the film surface 65 thereof which contacts with the substrate 64, the aluminum crystals exhibiting a diffraction X-ray spectrum of a (111) plane when measured by X-ray diffraction according to a diffractometer method under the following condition:

target: Cu,
X-ray type: Kα ray,
measurement X-ray output: voltage 40 KeV, current 30 mA,
longitudinal divergence limiting Sollar's slit: horizontal type,
incident height limiting slit: 5 mm,
incident slit: 0.4 mm,
light-receiving Sollar's slit: vertical type,
width limiting slit: 5 mm,
diffraction X-ray monochromator: graphite horizontal plate, and
diffraction method: $\theta/2\theta$ method.

Examples of the aluminum film coated matter will be described.

EXAMPLE 1

Using the ion beam sputtering apparatus as shown in FIG. 1, film forming was made as follows. That is, after an acrylic resin substrate 6a having a diameter of 300 mm as an example of the substrate 64 made of a synthetic resin (see FIG. 5) was mounted to a holder 4 and a high-purity aluminum target 28a was mounted to a target holder 32, the vacuum vessel 2 was evacuated to $2.0 \times 10^{-7}$ Torr. An inert gas ion beam 36 was drawn out from the ion source 34 in the following condition and radiated toward a surface of the aluminum target 28a, so that aluminum particles 38 sputtered out of the aluminum target 28a were deposited on a surface of the acrylic resin substrate 6a, thus to form an aluminum film on the acrylic resin substrate 6a. The thickness of the aluminum film was adjusted by the deposite time.

Ion Type: argon
Ion Beam Energy: 1500 eV
Beam Current: 300 mA

Aluminum films respectively having film thicknesses of 100 Å, 200 Å, 300 Å, 400 Å and 500 Å were formed on acrylic resin substrates 6a in the same manner as described above by the ion beam sputtering technique and then subjected to X-ray diffraction analysis. The results of the analysis are shown in FIGS. 6 through 10. As shown in FIGS. 7 through 10, the clear crystal orientation of aluminum in the (111) plane was confirmed when the film thickness was not less than 200 Å. It was found from this fact that the aluminum film formed by the aforementioned technique, especially, the aluminum film having a thickness of not less than 200 Å, is a film high in the surface density of aluminum atoms.

After an aluminum having a thickness of 3000 Å was formed on an acrylic resin substrate 6a in the same manner as described above, the rocking curve thereof was measured. As a result, no crystalline structure except the (111) plane was observed. The following conditions show the condition for measurement of the aforementioned X-ray diffraction and the condition for measurement of the rocking curve.

X-ray Diffraction Condition
Measuring Apparatus: X-ray diffraction apparatus RAD-2B made by RIGAKU Co., Ltd.
Target: Cu
X-ray Type: Kα ray
Measurement X-ray Output: voltage 40 KeV, current 30 mA
Longitudinal Divergence Limiting Sollar's Slit: horizontal type
Incident Height Limiting Slit: 5 mm
Incident Slit: 0.4 mm
Light-receiving Sollar's Slit: vertical type
Width Limiting Slit: 5 mm
Goniometer Radius: 185 mm
Diffraction X-ray Monochromator: graphite horizontal plate
Measuring Rate: 2 degrees per minute
Measuring Width: 0.02 degrees
Diffraction Method: $\theta/2\theta$ method (the measuring method in which the Bragg's condition ($2d \sin \theta = n\lambda$) is satisfied when the X-ray incident angle and the X-ray scattering angle are respectively designated by $\theta$ and $2\theta$)
Number of Times of Accumulation: 10 times (note 1)
(Note 1) The reason why the number of times of accumulation is selected to be plural is for the purpose of reducing noise through calculation of the average value.

Rocking Curve Measurement Condition
Measuring Apparatus: X-ray diffraction apparatus RAD-2B made by RIGAKU Co., Ltd.
Target: Cu
X-ray Type: Kα ray
Measurement X-ray Output: voltage 40 KeV, current 30 mA
Longitudinal Divergence Limiting Sollar's Slit: horizontal type
Incident Height Limiting Slit: 5 mm
Incident Slit: 0.4 mm
Light-receiving Sollar's Slit: vertical type
Width Limiting Slit: 5 mm
Goniometer Radius: 185 mm
Diffraction X-ray Monochromator: graphite horizontal plate
Measuring Rate: 2 degrees per minute
Measuring Width: 0.02 degrees
Diffraction Method: $2\theta$ fixed (note 2)
Number of Times of Accumulation: once
(Note 2) The angle of $2\theta$ was fixed to a position of aluminum polycrystal data according to JCPDS (Joint Committee of Powder Diffraction Standard).

EXAMPLE 2

Figure 11:
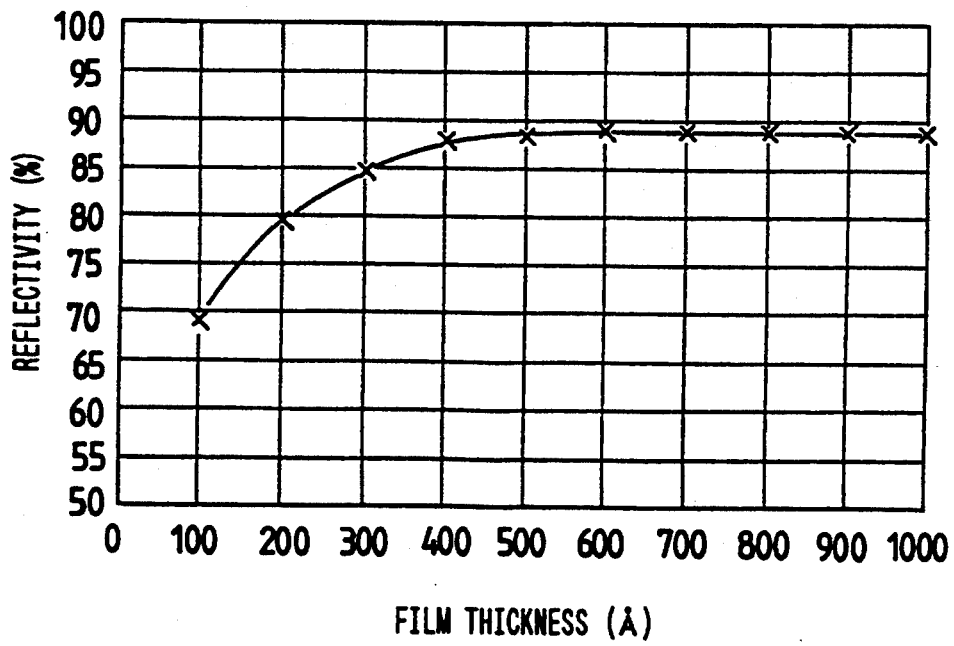
FIG. 11 is a schematic graph showing the relation between the thickness and the reflectivity of an aluminum film of Example 2 oriented in the (111) plane.

The relation between film thickness and reflectivity of an aluminum film formed by the ion beam sputtering technique in the same manner as in Example 1 was measured. The result of the measurement is shown in FIG. 11. It is apparent from the drawing that the increase of the reflectivity is observed as the film thickness increases to 600 Å and that the reflectivity becomes constant when the film thickness is not less than 600 Å. It is apparent from the result that the aluminum layer contributing to the reflectivity is in a depth range of not more than about 600 Å from the surface of the substrate. In the measurement of the reflectivity, 780 nm being the wave length of a semiconductor laser used for optical discs was used (the same wave length was applied to other examples and comparative examples).

EXAMPLE 3

Figure 12:
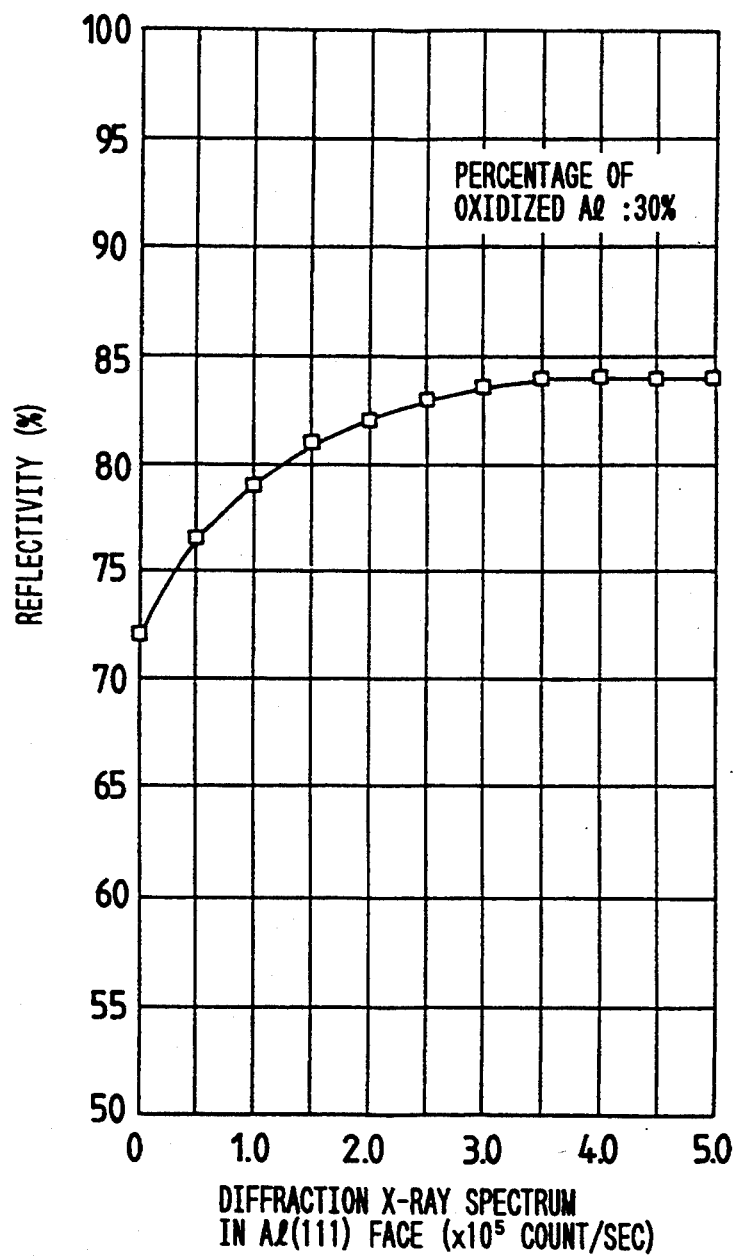
FIG. 12 is a graph showing the relation between the diffraction X-ray spectrum intensity in the (111) plane and the reflectivity of an aluminum film.

To confirm the relation between the diffraction X-ray spectrum in the (111) plane and the reflectivity of an aluminum film, aluminum film samples respectively having a thickness of about 3000 Å but different in diffraction X-ray intensity were formed on glass substrates by changing the temperatures of the substrates through the ion beam sputtering technique in the same manner as in Example 1 and then subjected to the measurement of the reflectivity thereof. In this case, the ratio of oxidized alminum to the total aluminum in the aluminum film was fixed to 30% to avoid the influence of the difference in the ratio on the reflectivity. From the measurement results obtained, the relation between the diffraction X-ray spectrum intensity in the (111) plane and the reflectivity is shown in FIG. 12. It is apparent from the drawing that the reflectivity decreases as the diffraction X-ray spectrum intensity in the (111) plane decreases. The X-ray diffraction measurement was carried out in the same condition as in Example 1.

EXAMPLE 4

After an aluminum film having crystal orientation in the (111) plane and having a thickness of 400 Å was formed on a video disc acrylic resin substrate in the same manner as in Example 1, the reflectivity thereof against laser light and the regenerative output were measured. The measurement produced good results: the reflectivity of 89% and the S/N ratio of 46 dB.

Further, a video disc was produced by using the matter obtained by the aforementioned process and was subjected to an acceleration deterioration test in a constant-temperature constant-humidity condition of 60° C. and 60%. As a result, deterioration of reproduced images was not observed at all even after the passage of 2000 hours.

COMPARATIVE EXAMPLES 1 AND 2

Figure 13:
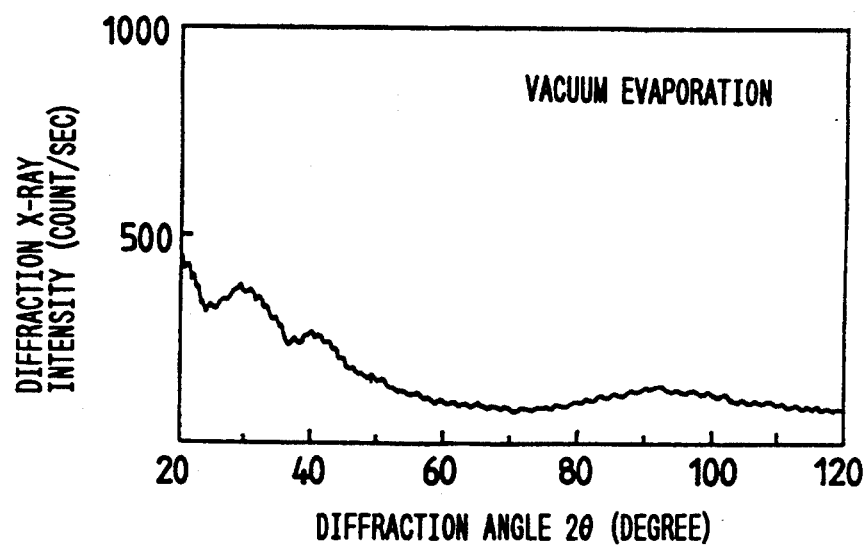
FIG. 13 is a schematic graph showing an example of the result of the X-ray diffraction analysis of an aluminum film formed by a conventional vacuum evaporation technique.
Figure 14:
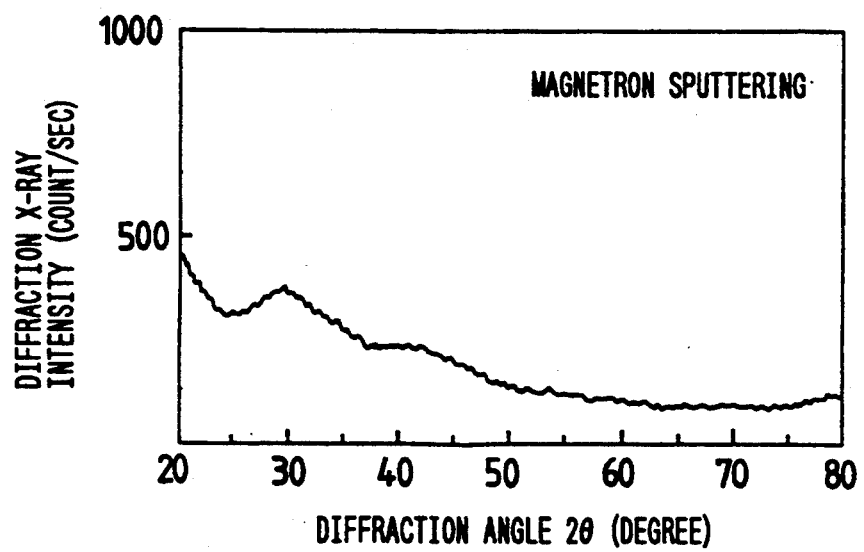
FIG. 14 is a schematic graph showing an example of the result of the X-ray diffraction analysis of an aluminum film formed by a conventional magnetron sputtering technique.

Aluminum films with the thicknesses of 2000 Å and 3000 Å were respectively formed on acrylic resin substrates by the vacuum evaporation technique and the plasma sputtering technique (magnetron sputtering technique) and subjected to X-ray diffraction analysis. As a result, no peak (diffraction X-ray spectrum) except the noise level was observed as shown in FIGS. 13 and 14 in the following X-ray diffraction condition when the diffraction angle $2\theta$ was in a range of 20 degrees to 80 degrees. It is apparent from the result that the aluminum films formed by the conventional techniques have a non-oriented crystal structure.

X-ray Diffraction Condition
  Measuring Apparatus: X-ray diffraction apparatus RAD-2B made by RIGAKU Co., Ltd.
  Target: Cu
  X-ray Type: $K\alpha$ ray
  Measurement X-ray Output: voltage 40 KeV, current 30 mA
  Longitudinal Divergence Limiting Sollar's Slit: horizontal type
  Incident Height Limiting Slit: 5 mm
  Incident Slit: 0.4 mm
  Light-receiving Sollar's Slit: vertical type
  Width Limiting Slit: 5 mm
  Goniometer Radius: 185 mm
  Diffraction X-ray Monochromator: graphite horizontal plate
  Measuring Rate: 2 degrees per minute
  Measuring Width: 0.02 degrees
  Diffraction Method: $\theta/2\theta$ method
  Number of Times of Accumulation: once

COMPARATIVE EXAMPLES 3 AND 4

Figure 15:
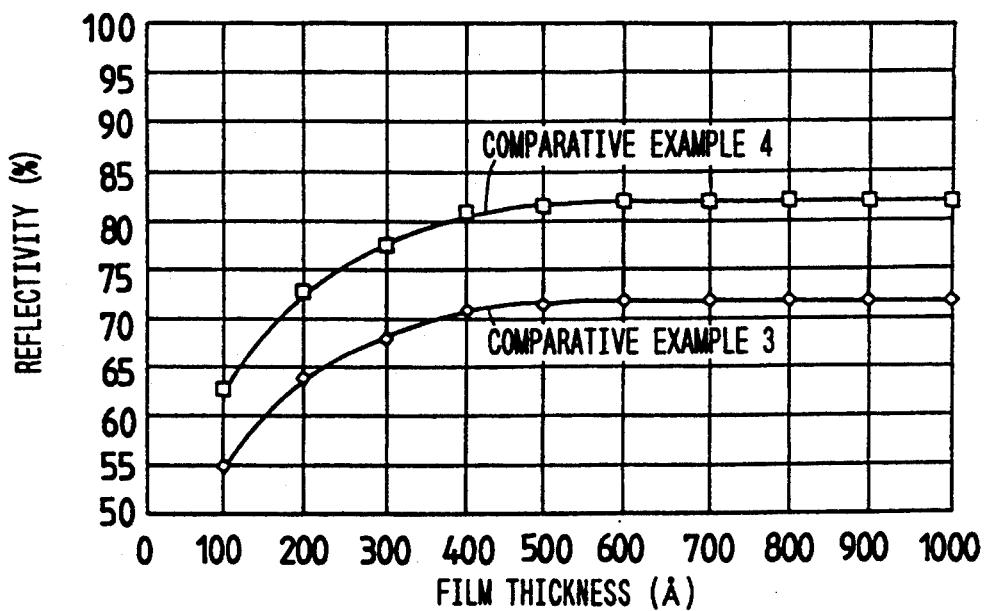
FIG. 15 is a graph showing the relation between the thickness and the reflectivity of an aluminum film formed by the conventional vacuum evaporation technique.
Figure 16:
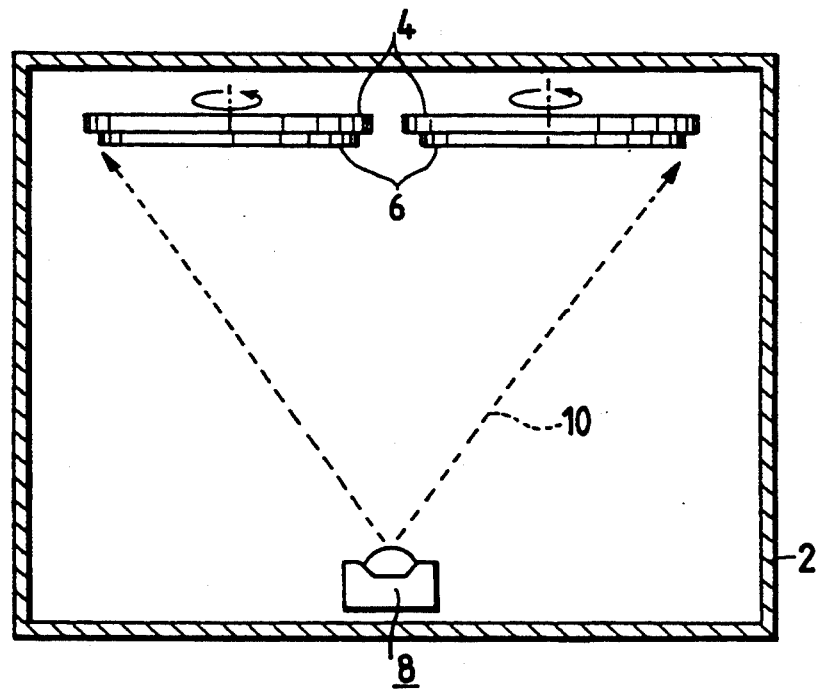
FIG. 16 is a schematic view showing an example of a conventional vacuum evaporation apparatus.
Figure 17:
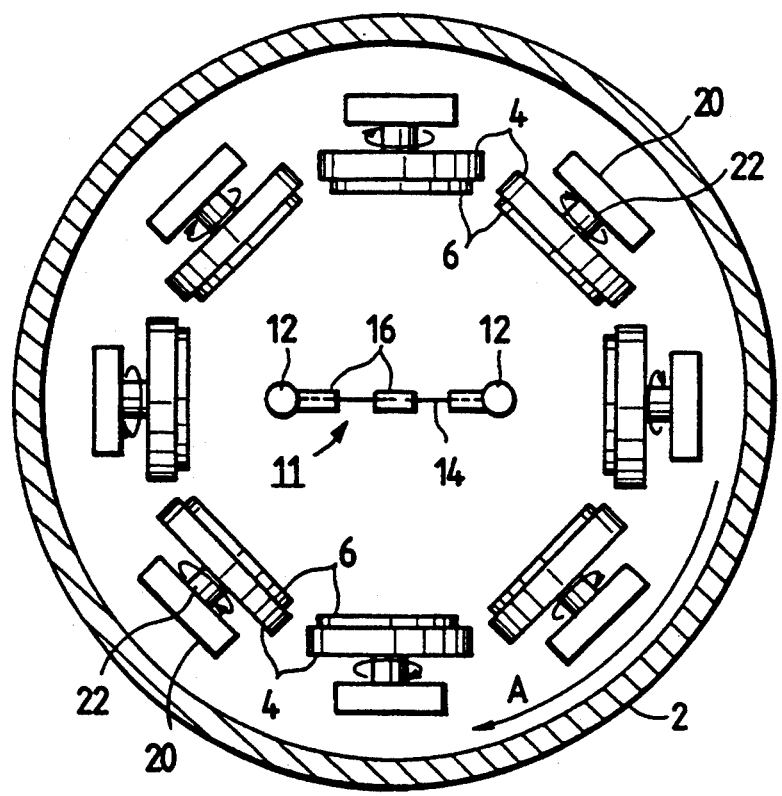
FIG. 17 is an upper view showing another example of a conventional vacuum evaporation apparatus.

The relation between the thickness and the reflectivity of aluminum films respectively formed by the vacuum evaporation technique under the condition that the degree of vacuum is $2 \times 10^{-4}$ Torr (Comparative Example 3) and under the condition that the degree of vacuum is $1 \times 10^{-}$ Torr (Comparative Example 4) is shown in FIG. 15. It is apparent from this result that the increase of the reflectivity is in either case observed as the film thickness increases to 600 Å and, that the reflectivity becomes constant when the film thickness is not less than 600 Å. This is the same as in the case of Example 2 shown in FIG. 11. Further, it is apparent that the reflectivity becomes higher when the degree of vacuum at the deposite time is improved. This is because the ratio of oxidized alminum not contributing to reflection in the aluminum film is reduced as described above when the degree of vacuum is improved (see the following description). As described above, the durability of the film is, however, lowered when the ratio of oxidized alminum is reduced.

EXAMPLE 5

The oxygen content (in the more strict sense, the oxidized alminum content) in each of the aluminum films formed in Examples 2 and 4 and Comparative Examples 3 and 4 was analyzed by X-ray photoelectron spectrscopy (XPS). Specifically, analysis was made in respective layers in the following measurement condition while 30 times–50 times repeating argon ion beam etching (condition: ion beam energy 2 KeV, beam current 20 mA, the degree of vacuum $3.8 \times 10^{-6}$ Torr) were conducted from the aluminum film surface toward the substrate until carbon (C) contained in the substrate became a main component, by using an X-ray photoelectron spectrometer ESCA-750 made by Shimadzu Seisakusho Ltd.

X-ray Photoelectron Spectroscopy Measurement Condition
  Measurement Element: $Al_{2P1/2}$, $Al_{2P3/2}$, $O_{1S}$
  Measurement X-ray Output: 8 KeV, 30 mA
  Target: Mg
  X-ray Type: $K\alpha$ ray
  Measurement Pressure: $7.5 \times 10^{-8}$ Torr
  Measurement Range: 68–82 eV, 278–295 eV, 526–540 eV
  Measuring Width: 0.1 eV
  Measuring Time: 200 msec per step
  Number of Times of Accumulation: twice In most cases, the thus obtained $Al_{2P1/2}$ and $Al_{2P3/2}$ spectra of the respective layers exhibit a mixture state of oxidized alminum (Al-O) and metal aluminum (Al). Therefore, after the respective spectra were separated into an oxidized alminum peak and a metal aluminum peak, the area ratio (that is, mole ratio Al-O/Al) of oxidized alminum (Al-O) to total aluminum (Al) was calculated. Then, a graph was obtained through plotting the area ratio in a direction of the depth of the film. Since the graph is normally a concave curve having high values at both surfaces of the film and low values at the inside of the film, the lowest value of the curve was defined as the minimum value. The minimum value is normally proportional to the amount of the oxidized aluminum (Al-O). As the result of the analysis, the minimum value in each of the aluminum films obtained in Examples 2 and 4 was 15% and the minimum values in the aluminum films obtained in Comparative Examples 3 and 4 were 35% and 20%, respectively.

EXAMPLE 6

The characteristics, inclusive of durability, of the aluminum films obtained in Example 2 and Comparative Examples 3 and 4 in the two cases of the thickness of 300 Å and the thickness of 600 Å are collectively shown in Table 3. The reflectivity in each of the aluminum films is the same as shown in FIGS. 11 and 15. The durability in each of the aluminum was estimated on the basis of deterioration of reproduced images by applying an acceleration deterioration test to a video disc having an aluminum film formed in the same condition as in each example after putting the video disc into a constant-temperature constant-humidity tank of 60° C. and 60%.

TABLE 3

|  | Crystal property | Film thickness (Å) | Reflectivity (%) | Al—O distribution minimum (%) | Durability | Total estimation |
|---|---|---|---|---|---|---|
| Example 2 | (111) | 300 | 85 | 15 | Good | Good |
|  | (111) | 600 | 89 | 15 | Good | Good |
| Comparative example 3 | Not oriented | 300 | 68 | 35 | Good | Bad |
|  | Not oriented | 600 | 72 | 35 | Good | Bad |
| Comparative example 4 | Not oriented | 300 | 78 | 20 | Bad | Bad |
|  | Not oriented | 600 | 82 | 20 | Bad | Bad |

As is obvious from this Table, the aluminum film in Example 2 exhibits high reflectivity and good durability in either film thickness. On the other hand, the aluminum film in Comparative Example 3 is good in durability but low in reflectivity, because the oxidized alminum content thereof is large. On the contrary, the aluminum film in Comparative Example 4 is considerably high in reflectivity but poor in durability, because the oxidized alminum content thereof is small.

Not only the aluminum film coated matter according to this invention is adapted to optical information recording media such as video discs, compact discs, compact disc read only memories (CD-ROM), write once (WO) discs, and rewritable (RW) discs, but it is adapted to goods particularly requiring high reflectivity and durability, such as optical parts, miscellaneous decoration goods, etc.

As described above, the aluminum film coated matter according to this invention contains aluminum crystals oriented as described above in the film, so that the film is high in light reflectivity and excellent in durability. Accordingly, when, for example, the aluminum film coated matter is used as an optical information recording medium, not only improvement both in reflectivity and in S/N ratio can be attained but improvement in durability can be attained.

What is claimed is:

1. A process for forming a metal film on a surface of synthetic resin substrate, comprising the steps of:
   evacuating a vacuum vessel containing said synthetic resin substrate and metal target;
   providing a means including an electrostatic shield which covers said synthetic resin substrate for preventing diffusion of an inert gas plasma to a surface of said synthetic resin substrate and for preventing inflow of acceleration electrons from said plasma to the surface of said synthetic resin substrate; and
   sputtering said metal target by ions in said plasma in a vacuum atmosphere so that said metal film having a thickness of 50 to 400 Å is formed on the surface of said synthetic resin substrate.

2. The process for forming a metal film as claimed in claim 1, wherein said metal target is an aluminum target.

3. The process for forming a metal film as claimed in claim 1, wherein said synthetic resin substrate is an acrylic resin substrate.

* * * * *